United States Patent [19]
Baldwin et al.

[11] Patent Number: 5,764,146
[45] Date of Patent: Jun. 9, 1998

[54] MULTIFUNCTION OCCUPANCY SENSOR

[75] Inventors: John R. Baldwin, Newtown; Thomas J. Batko, Wallingford; David F. Ellison, Westport, all of Conn.

[73] Assignee: Hubbell Incorporated, Orange, Conn.

[21] Appl. No.: 738,045

[22] Filed: Oct. 25, 1996

Related U.S. Application Data

[63] Continuation-in-part of Ser. No. 412,502, Mar. 29, 1995, and a continuation-in-part of Ser. No. 705,778, Aug. 30, 1996.

[51] Int. Cl.$^6$ ............................................. G08B 13/193
[52] U.S. Cl. .................. 340/567; 250/221; 250/338.3; 250/340; 307/116; 307/117; 340/521; 340/577; 340/693
[58] Field of Search ............................ 340/567, 521, 340/522, 693; 307/116, 117; 250/338.3, 340, 221

[56] References Cited

U.S. PATENT DOCUMENTS

| | | | |
|---|---|---|---|
| 4,752,769 | 6/1988 | Knaup et al. | 340/567 |
| 4,864,136 | 9/1989 | Behlke | 250/338.3 |
| 4,906,976 | 3/1990 | Guscott | 340/568 |
| 5,106,325 | 4/1992 | Robinson et al. | |
| 5,115,967 | 5/1992 | Wedekind | |
| 5,126,718 | 6/1992 | Doctor | 340/567 |
| 5,221,919 | 6/1993 | Hermans | 340/567 |
| 5,266,807 | 11/1993 | Neiger | |
| 5,290,175 | 3/1994 | Robinson et al. | |
| 5,395,042 | 3/1995 | Riley et al. | |
| 5,479,812 | 1/1996 | Juntunen et al. | |
| 5,486,810 | 1/1996 | Schwarz | 340/567 |
| 5,509,108 | 4/1996 | Yeh | |
| 5,525,846 | 6/1996 | Newell et al. | |
| 5,586,048 | 12/1996 | Covely | 307/117 |
| 5,640,143 | 6/1997 | Myron et al. | 340/567 |

OTHER PUBLICATIONS

Lonmark Application Layer Interoperability Guidelines, Lonmark Interoperability Association, pp., 1–1–4–3.

*Primary Examiner*—Glen Swann
*Attorney, Agent, or Firm*—Jerry M. Presson; William C. Roch

[57] ABSTRACT

A multifunction passive infrared occupancy sensor functions as an occupancy sensor for security systems and also as an occupancy sensor for energy management control systems. The occupancy sensor comprises at least one segmented infrared lens array wherein the segments of the infrared lens array establish different optical lobes in the field of view of the occupancy sensor. At least one pyroelectric infrared detector is positioned at or near the focal point of the segmented infrared lens array, for detecting movement of infrared sources within the field of view of the occupancy sensor and producing an output signal representative thereof. A processing means analyzes the output signal of the detector for security detection purposes by detecting changes in the output signal greater than a given security threshold. The processing means also analyzes the output signal of the detector for energy management purposes by detecting changes in the output signal greater than a given energy management threshold, which is less than the security threshold. In one embodiment first and second processing circuits detect changes in the detector output signal greater than the security threshold and energy management threshold. In a second embodiment the output of the detector is coupled to an analog to digital converter, the output of which is coupled to a digital processor which utilizes one of two different software processing routines, a security threshold processing routine, and an energy management threshold processing routine. A further embodiment electronically switches detector elements in a detector element array.

20 Claims, 6 Drawing Sheets

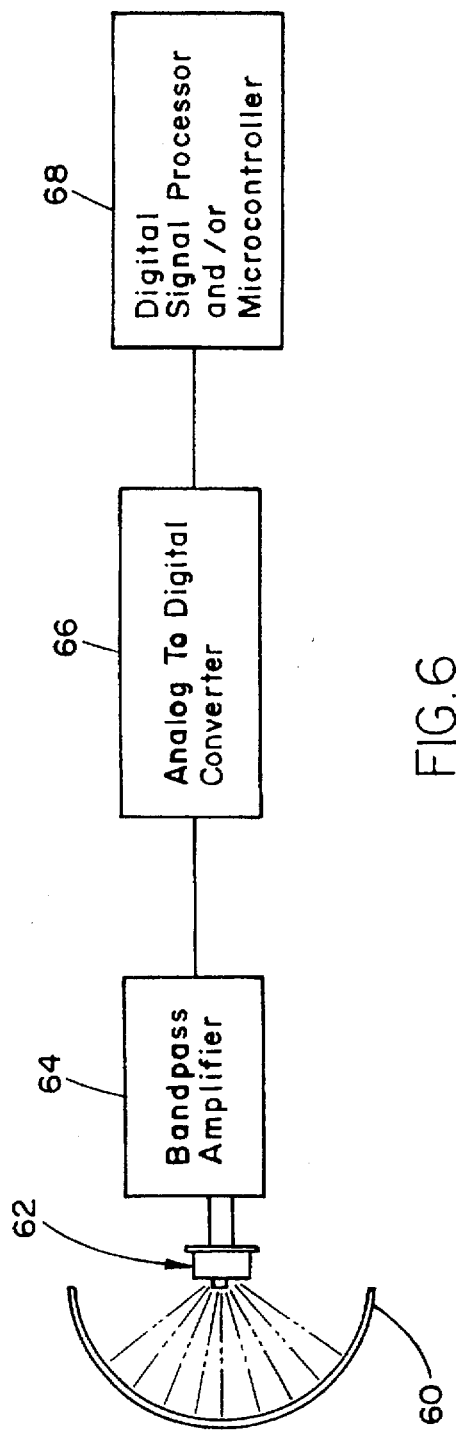
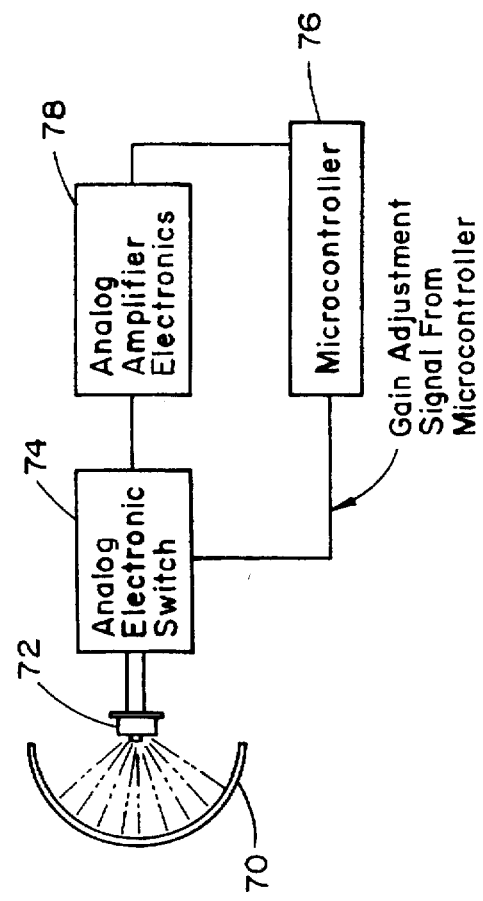
FIG.6
FIG.7

MULTIFUNCTION OCCUPANCY SENSOR

This patent application is a continuation-in-part application of patent application Ser. No. 08/412,502, filed Mar. 29, 1995 for a Motion Sensing System With Adaptive Timing for Controlling Lighting Fixtures and of patent application Ser. No. 08/705,778, filed Aug. 30, 1996, for a Temperature and Passive Infrared Sensor Module.

BACKGROUND OF THE INVENTION

1. Field of the Invention

The present invention relates generally to a multifunction occupancy sensor, and more particularly pertains to a multifunction occupancy sensor as might be utilized in an occupied space networked environment such as an automated commercial or industrial building in which multiple sensors are installed to sense and control various parameters therein.

The present invention relates to a multifunction occupancy sensor which provides a first occupancy output signal for security systems and a second occupancy output signal for energy management control systems. The multifunction occupancy sensor is particularly useful in a multifunction sensor module which provides a plurality of parameter sensors in one sensor module which can interface with and control operation of one or more processor control systems in an occupied space networked environment. The multifunction sensor can comprise at least an occupancy sensor, an ambient light sensor, and a temperature sensor. A common network communications and control processor is coupled to a common communication transceiver, and are shared in common by the occupancy sensor, the ambient light sensor, and the temperature sensor, such that the multifunction sensor can interface with and control operation of one or more processor control systems in the occupied space networked environment. The multifunction network sensor system further comprises energy management and security controller systems, and a common data communication network which connects to the multifunction sensor and the controller systems to form a local operational network in a building. A plurality of the multifunction sensors are placed at different locations throughout the building. Each multifunction sensor is assigned a unique location address, and can transmit and receive data, including its own unique address, over the data communication network.

2. Discussion of the Prior Art

Traditionally, separate sensors have been used for occupancy sensing for energy management control systems such as lighting control systems, Heating, Ventilating and Air Conditioning (HVAC) control systems, Demand Side Management (DSM) electrical load management control systems, presence monitoring systems, and for security sensing in security systems, although modules combining occupancy sensing and ambient light sensing have been used in nonnetworked systems.

In general, the tripping of an occupancy sensor in a security system has more serious consequences than the tripping of an occupancy sensor in an energy management control system such as a lighting control system, or an HVAC system, or a DSM system, or in a presence monitoring system. For instance, the tripping of an occupancy sensor in a lighting control system will merely extend the time which the control system maintains full illumination in a controlled lighting environment. In contrast thereto, the tripping of an occupancy sensor in a security system can result in the dispatching of security personnel or police to the monitored premises to personally check the premises for a security breach or intrusion. If the alarm turns out to be a false alarm, a substantial financial penalty charge is often imposed in an attempt to discourage additional false alarms.

Passive Infrared (PIR) sensors, typically 8 to 14 micron wavelength, are well known in the art, and are frequently used as occupancy sensors in security systems, and in energy management control systems such as lighting control systems or HVAC systems or DSM systems, and in presence monitoring systems. Passive infrared sensors frequently comprise a segmented lens, such as a Fresnel lens, wherein the segments of the lens establish different optical lobes in the field of view, and an IR pyroelectric detector, and detect movement of IR sources within the field of view of the detector. Accordingly, such PIR sensors can be used as occupancy sensors in security systems and also in energy management control systems such as in lighting control systems or HVAC systems or DSM systems and also in presence monitoring systems.

In order to make occupancy sensors in security systems more reliable and accurate, as compared to occupancy sensors in energy management systems, occupancy sensors for security systems are characterized by basic design differences, among which are the following key differences: (1) higher electronic S/N ratios, (2) more conservative trip criteria, and (3) optical fields of view with increased optical sensitivity, hence fewer fields of view. Increased optical sensitivity means larger optical lens segments, while fewer optical segment fields of view means less sensitivity to small movements within the detection pattern of the sensor. In energy management sensors, more sensitivity to small movements can be achieved by employing more segments in the lens to increase the number of optical lobes, and also by employing more separate detector elements in the pyroelectric detector upon which the optical lobes are focused.

SUMMARY OF THE INVENTION

It would be desirable to provide a plurality of parameter sensors in one multifunction sensor module which can interface with one or more controllers on the network to control operation of security systems, energy management systems, etc. in an occupied space networked environment such as an automated commercial or industrial building. Such controllers are available commercially which incorporate networking such as an Echelon LONWORKS system, CEBus, BacNet, etc. In such a multifunction sensor module, it would also be desirable to combine parameter sensors where possible, for instance in a multifunction occupancy sensor which could be used by a security system and also by energy management systems. However, as mentioned above, occupancy sensors employed in security systems, when compared to occupancy sensors for use in energy management control systems, are characterized by basic design differences, among which are the following key differences: (1) higher electronic S/N ratios, (2) more conservative trip criteria, and (3) optical fields of view with increased optical sensitivity, hence fewer optical segment fields of view.

The present invention recognizes that the first two key differences can be controlled by an intelligent control network system such as those offering interoperability and a media independent communication protocol, e.g. LONWORKS. Thus, a sensor can be remotely or locally configured for both security sensor parameters and energy management control parameters. The intelligent control can reconfigure the PIR occupancy sensor to switch back and forth between these two sets of parameters. A judicious balance between the optical sensitivity of the optical segment fields of view and the trip criteria can be used to develop a combination security and energy management control sensor.

Accordingly, it is a primary object of the present invention to provide a multifunction occupancy sensor which provides a first occupancy signal for security systems and a second occupancy output signal for energy management control systems.

A further object of the subject invention is the provision of a multifunction occupancy sensor particularly useful in a multifunction sensor module which provides a plurality of parameter sensors in one sensor module which can interface with and control operation of one or more processor control systems in an occupied environment.

In accordance with the teachings herein, the present invention provides a multifunction passive infrared occupancy sensor which functions as an occupancy sensor for security systems and also as an occupancy sensor for energy management control systems. The occupancy sensor comprises a segmented infrared lens array wherein the segments of the infrared lens array establish different optical lobes in the field of view of the occupancy sensor. A pyroelectric infrared detector is positioned at or near the focal point of the segmented infrared lens array, for detecting movement of infrared sources within the field of view of the occupancy sensor and producing an output signal representative thereof. A processing means analyzes the output signal of the detector for security detection purposes by detecting changes in the output signal greater than a given security threshold. The processing means also analyzes the output signal of the detector for energy management purposes by detecting changes in the output signal greater than a given energy management threshold, which is less than the security threshold.

In greater detail, one embodiment includes a single optical lens array which is designed to meet security requirements, and provides an optical gain of b 2X or more and a minimal number of optical segment fields of view, which provides less sensitivity to small movements within the field of view of the sensor than an optical lens array designed for energy management requirements.

In one embodiment a first processing circuit detects changes in the detector output signal greater than the security threshold, and a second processing circuit detects changes in the detector output signal greater than the energy management threshold.

In a second embodiment the output of the detector is coupled to a single analog to digital converter, the output of which is coupled to a digital processor which utilizes one of two different software processing routines, the first processing routine utilizing a security threshold and the second processing routine utilizing an energy management threshold.

In a third embodiment an analog control switch controls amplification of the detector output signal under control of a microcontroller to configure the sensor as an energy management control sensor with a greater circuit amplification gain or as a security sensor with a less circuit amplification gain.

In a further embodiment the multifunction sensor is configured as an energy management control sensor and when a detected event occurs, the sensor switches to a security sensor configuration for a period of time and looks for security detected events, and if no security events are detected, the sensor returns to energy management control.

In a further embodiment the detector comprises an array of a number of separate sensing elements, and the number of active sensing elements is electronically switched to control the number of fields of view provided by each lens array segment. The system increases the field of view density for the energy management control sensor by adding sensing elements, and decreases the field of view density for the security sensor by subtracting sensing elements. The number of separate detector elements in the array preferably comprises three or more detector elements. A processor electronically switches the number of active sensing elements to control the number of fields of view provided by each lens array segment.

In a further embodiment the lens means comprises a first optical lens array designed for security and having a first number of lens segments, and a second optical lens array designed for energy management and having a second number of lens segments, greater than the first number of lens segments, which provides greater sensitivity to small movements within the field of view of the sensor. The detector comprises a separate security detector and a separate energy management detector, and further comprises a separate security amplifier having a security amplification gain, and a separate energy management amplifier having a greater circuit amplification gain than the security amplifier. The ratio of energy management amplifier gain to the security amplifier gain is preferably in the range of 3:1 to 5:1.

The processor detects predetermined positive or negative changes in the output signal from a baseline average voltage level, which can be greater than 500 millivolts. The processor can detect two sequential changes of opposite polarity in the output signal which occur within a window timeframe, which is preferably greater than 75 milliseconds and less than 2 seconds. The processor can also detect three or more sequential changes of alternating opposite polarity in the output signal, when adjacent changes in the output signal occur within a window timeframe, preferably greater than 75 milliseconds and less than 2 seconds.

BRIEF DESCRIPTION OF THE DRAWINGS

The foregoing objects and advantages of the present invention for a multifunction occupancy sensor may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 6 is a schematic illustration of a second embodiment of the present invention which uses a single common optical array for both security and energy management control with a single detector, amplifier and A/D converter, followed by a digital signal processor which employs two different software processing routines, a first processing routine designed for security and the second processing routine designed for energy management control;

FIG. 7 is a schematic illustration of a third embodiment of the present invention which also uses a single common optical array with a single detector for both security and energy management control, followed by an analog control switch which controls amplification of the pyro output signal under control of a microcontroller to configure the sensor as either an energy management control sensor or as a security sensor;

DETAILED DESCRIPTION OF THE DRAWINGS

Figure 1:
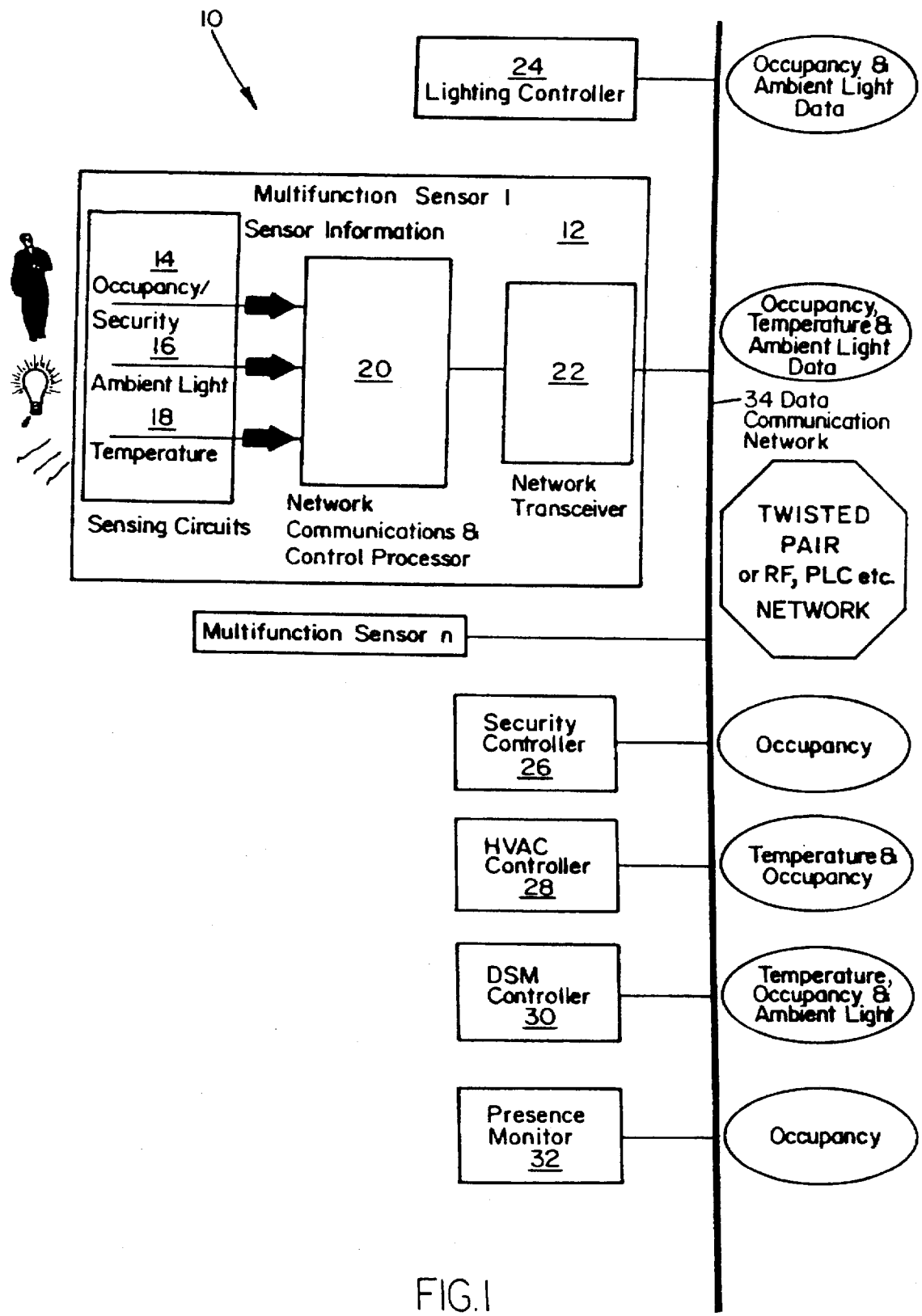
FIG. 1 is a block diagram of a multifunction network sensor system pursuant to the present invention which comprises multifunction sensors, each of which generally includes at least an occupancy sensor, a temperature sensor and an ambient light sensor, all of which share the same network communications and control processor and the same network communication transceiver, and a plurality of energy management and security controller systems, all of which are connected to a common data communication network.

Referring to the drawings in detail, FIG. 1 is a block diagram of a multifunction network sensor system 10 pursuant to the present invention which comprises multifunction sensors 12, each of which generally includes at least an occupancy sensor 14, an ambient light sensor 16, and a temperature sensor 18, all of which share the same network communications and control processor 20 and the same communication transceiver 22. The multifunction network sensor system 10 further comprises energy management and security controller systems 24, 26, 28, 30 and 32, and a common data communication network 34 which connects to all of the multifunction sensors and controller systems.

Different multifunction sensors 12 (1 to n) can be placed at various locations throughout a building, typically at least one on each floor level. The multifunction sensors are typically housed in small plastic enclosures such as those illustrated in FIGS. 2, 3 and 4. The occupancy (or motion) sensor 14 technology can be passive infrared (PIR), IR, ultrasonic, sonic, RF, microwave, radar or any other effective occupancy sensing technology. One preferred version is a Passive Infrared (PIR) design which can be used in hallways, rooms/offices or open office cubicles, each provided with a lens designed to optimize the field of view and motion detection for that particular application.

Each multifunction sensor 12 is assigned a unique location address, and is connected to the common data communication network 34 located throughout the building to form a local operating network. Each multifunction sensor 12 can transmit and receive data, including its own unique address, over the data communication network 34 on a continual periodic basis, such as every 5 seconds, or can respond when polled by an energy management or security controller.

The data communication network 34 is also accessed by control systems requiring data such as: one or more lighting controllers 24 which require data from one or more of the multifunction sensors 12 on occupancy and ambient light; one or more security controllers 26 which require data from one or more of the multifunction sensors 12 on occupancy or security intrusion; one or more HVAC controllers 28 which require data from one or more of the multifunction sensors 12 on occupancy and temperature; one or more DSM controllers 30 which require data from one or more of the multifunction sensors 12 on occupancy, temperature and ambient light; and one or more presence monitors 32 which require data from one or more of the multifunction sensors 12 on occupancy. The lighting, HVAC, DSM and security controllers can comprise one composite controller or individual controllers connected to the common data bus.

The data communication network 34 can use any suitable technology or physical transmission media such as twisted wire pair, power line carrier (PLC), RF, fiber optics, etc., and can employ any suitable common bus data communications protocol such as LONWORKS, CEBus, BacNet, etc.

Each multifunction sensor 12 will generally include sensors for detecting occupancy, ambient light level, and temperature, and can provide optimum cost/function design variations by using all three, any two, or any one of these three basic sensing functions, depending upon the user requirements/application. Each multifunction sensor can also include additional sensors for detecting time-of-day, relative humidity, $CO_2$ and other parameters. However, it should be noted that the mounting and exposure requirements of the diverse parameter sensors in one sensor module are often quite different, such that it is sometimes difficult to mount the diverse sensors in a common sensor module. For instance, a temperature sensor should be mounted to be exposed to a flow of air from the environment of a room being monitored, while a passive infrared occupancy sensor should be mounted so as not to be exposed to a flow of air from the environment of the room being monitored. The temperature sensor should also be insulated or shielded from direct exposure to and heat loading from sunlight. Patent application Ser. No. 08/705,778, filed Aug. 30, 1996, discloses and teaches compatible mounting arrangements for a temperature sensor and a passive infrared sensor.

The multifunction sensor and network sensor system are described in detail in copending patent application Ser. No. 08/738,044, for Multifunction Sensor And Network Sensor System, filed on Oct. 25, 1996, the entire disclosure of which is hereby expressly incorporated by reference herein.

Figure 2:
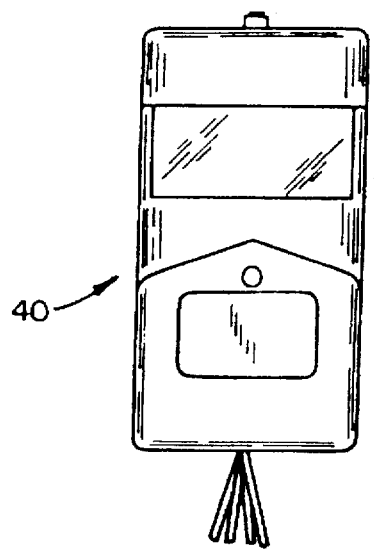
FIGS. 2, 2A, 3, 3A, 4 and 4A illustrate three different types of multifunction sensors pursuant to the present invention, a wallmount multifunction sensor, a ceiling mount multifunction sensor, and a wall switch multifunction sensor, each of which could be utilized in the multifunction network sensor system of FIG. 1.
Figure 2A:
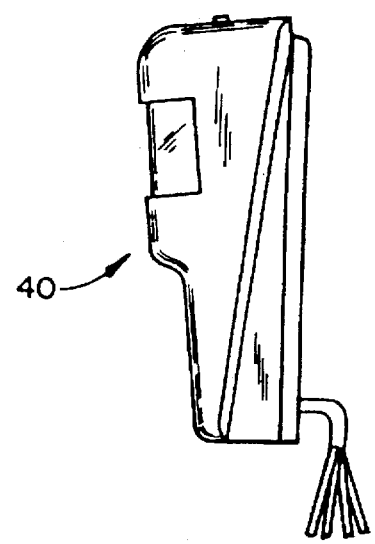
Figure 3:
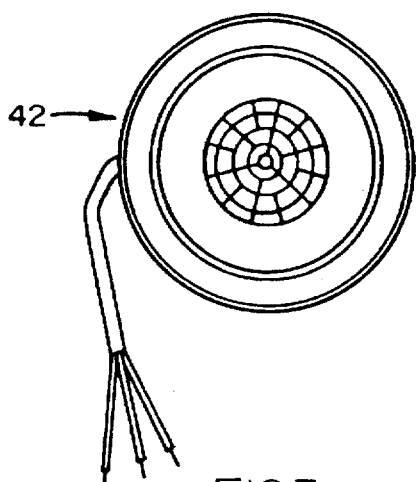
Figure 3A:
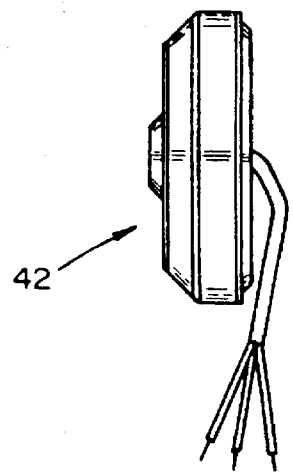
Figure 4:
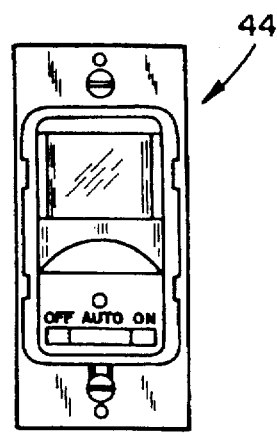
Figure 4A:
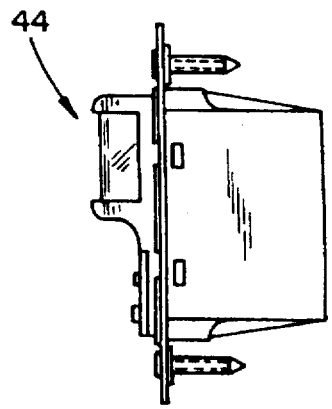

FIGS. 2, 3 and 4 illustrate three different types of multifunction sensors pursuant to the present invention, a wallmount multifunction sensor 40, a ceiling mount multifunction sensor 42, and a wall switch multifunction sensor 44, each of which could be utilized in the multifunction network sensor system of FIG. 1. The wallmount multifunction sensor 40 is similar to the wall switch multifunction sensor 44, except that the wall switch multifunction sensor 44 mounts recessed in a wall switch receptacle box rather than flush upon a wall. The ceiling mount multifunction sensor 42 is similar to units 40 and 44 electrically, but generally will not include a temperature sensor, and a front switch as shown in FIG. 4

The different wallmount and ceiling mounted multifunction sensors and the segmented lens arrays for the different multifunction sensors are described in detail in copending patent application Ser. No. 08/736,864 for Multiple Optical Designs For A Multifunction Sensor, filed on Oct. 25, 1996, the entire disclosures of which is hereby expressly incorporated by reference herein.

It would be desirable to provide a multifunction sensor in which a multifunction occupancy sensor could be used by a security system and also by energy management control systems.

The following represents a simplified approach and analysis of the optical and electronic approaches and variables in energy management (e.g. lighting) and security processing.

| Electronic Design | Range | Optical Gain (Using Standard Input Signal) | Circuit Gain | Threshold |
|---|---|---|---|---|
| Security | 40' | 4X | 1700 | 500 mv |
| Energy Management | 40' | X = Ref. | 6700 | 500 mv |
| Combination Sensor (In Security Mode) | 20' (est.) | 2X | 1700 | 500 mv |
| Combination Sensor (In Energy Management Mode) with Small Motion in the Detection Pattern | 20' (est.) | 2X | 1700 | 200 mv |
| Combination Sensor (In Energy Management Mode) with Large Motion in the Detection Pattern | 40' (est.) | 2X | 1700 | 200 mv |
| Combination Sensor (In Energy Management Mode) with Small Motion in the Detection Pattern with a Quad Linear Array Pyro | 30'-40' (est.) | 2X | 1700 | 200 mv |

A Simplified Analysis:

(Target Signal pk)$_{security}$ X (Optical Gain)$_{security}$ X (Electronic Gain)$_{security}$ = 500 mv
(Optical Gain)$_{security}$ = (500 mv)/((Target Signal pk)$_{security}$ X (Electronic Gain)$_{security}$)
  = 500 mv/(1700 X (Target Signal pk)$_{security}$)
  = 290 uv/(Target Signal pk)$_{security}$
(Target Signal Pk)$_{energy\ management}$ X (Optical Gain)$_{energy\ management}$ X (Electronic Gain)$_{energy\ management}$ = 500 mv
(Optical Gain)$_{energy\ management}$ = 500 mv/(Target Signal pk)$_{energy\ management}$ X (Electronic Gain)$_{energy\ management}$)
  = 500 mv/(6700 X (Target Signal pk)$_{energy\ management}$)
  = 75 uv/(Target Signal pk)$_{energy\ management}$.
If (Target Signal Pk)$_{energy\ management}$ = (Target Signal pk)$_{security}$
Then: (Optical Gain)$_{security}$/(Optical Gain)$_{energy\ management}$
  = 290 uv/75 uv = 3.7:1

Hence a combination energy management and security sensor would have an optical gain in the range of range of X to 4X but, with all factors considered, 2X or more and as close to 4X as is feasible. An optical gain of 2X for the combination sensor, in conjunction with a reduction in range (e.g. from 40' to 20'), enables us to preserve the electronic gain of the security sensor. This retains the security sensor threshold to noise relationship and corresponding rejection of electronically induced false trip signals.

It is noted that in the above table, the ratio of energy management circuit gain to security circuit gain is 6700/1700 or 3.9, and as a practical matter a ratio in the range of 3 to 5 is preferred.

The output of the PIR sensor can be evaluated according to the following specifications.

1.) detect predetermined positive or negative excursions, e.g. 500 millivolts, from a baseline average voltage level, e.g. 2.5 volts.

2.) Signal a motion detection trip when 2 sequential excursions are of opposite polarity and occur within a 75 milliseconds (typical) to 2 seconds (typical) time window. As an alternative, signal a motion detection trip when 3 or more sequential excursions are of alternating opposite polarity and adjacent excursions occur within a 75 milliseconds (typical) to 2 seconds (typical) time window.

3.) For Security Sensor: Standard Gain (Reference=0 dB)
For Energy Management Sensor: Increase Sensitivity, e.g. by 8 dB (typical)

The present invention can use a passive infrared (PIR) sensor such as pyro sensor model no. RE03HBBEC, manufactured by Nippon Ceramic Co., Ltd. of Japan, which detects infrared radiation in the range of 8 to 14 microns. The pyro sensor can be connected to an amplifier such as a dual op-amp circuit model no. TLC27L2CD manufactured by Texas Instruments Inc. of Dallas, Tex. The lens can be a lens used in sensor model no. MSFL-1200 lens from Bryant Electric, Inc. of Milford, Conn., which typically outputs a signal indicating detected motion whenever detected PIR is outside a 2.5 volt±0.5 volt threshold.

Figure 5:
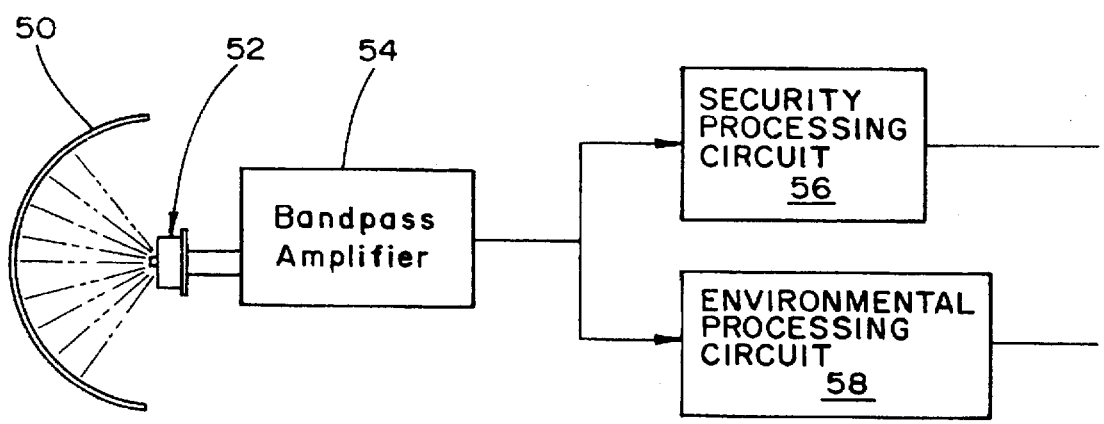
FIG. 5 is a schematic illustration of a first embodiment of the present invention which uses a single common optical array, detector and amplifier for both security and energy management control applications, with two different processing circuits at the output of the amplifier, a first processing circuit designed for security criteria and the second processing circuit designed for energy management control criteria.

FIG. 5 illustrates a first embodiment of the present invention which uses a single common optical lens array 50, detector 52 and amplifier 54 for both security and energy management control applications with two different processing circuits 56, 58 at the output of the amplifier. The first processing circuit 56 is designed pursuant to security criteria, and the second processing circuit 58 is designed pursuant to energy management control criteria. The common optical array 50, detector 52 and amplifier 54 are designed to meet security requirements or an acceptable compromise for optical sensitivity and amplifier gain. The energy management control threshold in the second processing circuit 58 is designed to be a required amount lower than the security threshold in the first processing circuit 56. The security processing circuit 58 has a more conservative trip criteria, e.g. bipolar signal requirements or signal signature requirements. A typical prior art PIR detector 52 has two separate sensing elements, and the output signals from the two elements combine electronically to form output signals of a predominant polarity (depending upon motion direction through the fields of view of the elements) with adjacent opposite polarity excursions which may be close to or very different in amplitude from the predominant excursion.

A variation of the first embodiment of the present invention also uses a single common optical array for both security and energy management control. If the sensor is configured as an energy management control sensor when a trip (detected event) occurs, it switches to a security sensor configuration for a period of time (e.g. 10 minutes or 50% of the delay time setting) and looks for security trips. If no security trips are detected, it returns to the energy management control mode of operation.

FIG. 6 is a schematic illustration of a second embodiment of the present invention which uses a single common optical lens array 60 for both security and energy management control with a single detector 62, amplifier 64, and A/D converter 66, followed by a processor 68 which utilizes one of two different software processing routines, the first processing routine designed pursuant to security criteria and the second processing routine designed pursuant to energy management control criteria. Again, the common optical lens array 60, detector 62 and amplifier 64 are designed to meet security requirements or are an acceptable compromise for optical sensitivity and amplifier gain.

Figure 10:
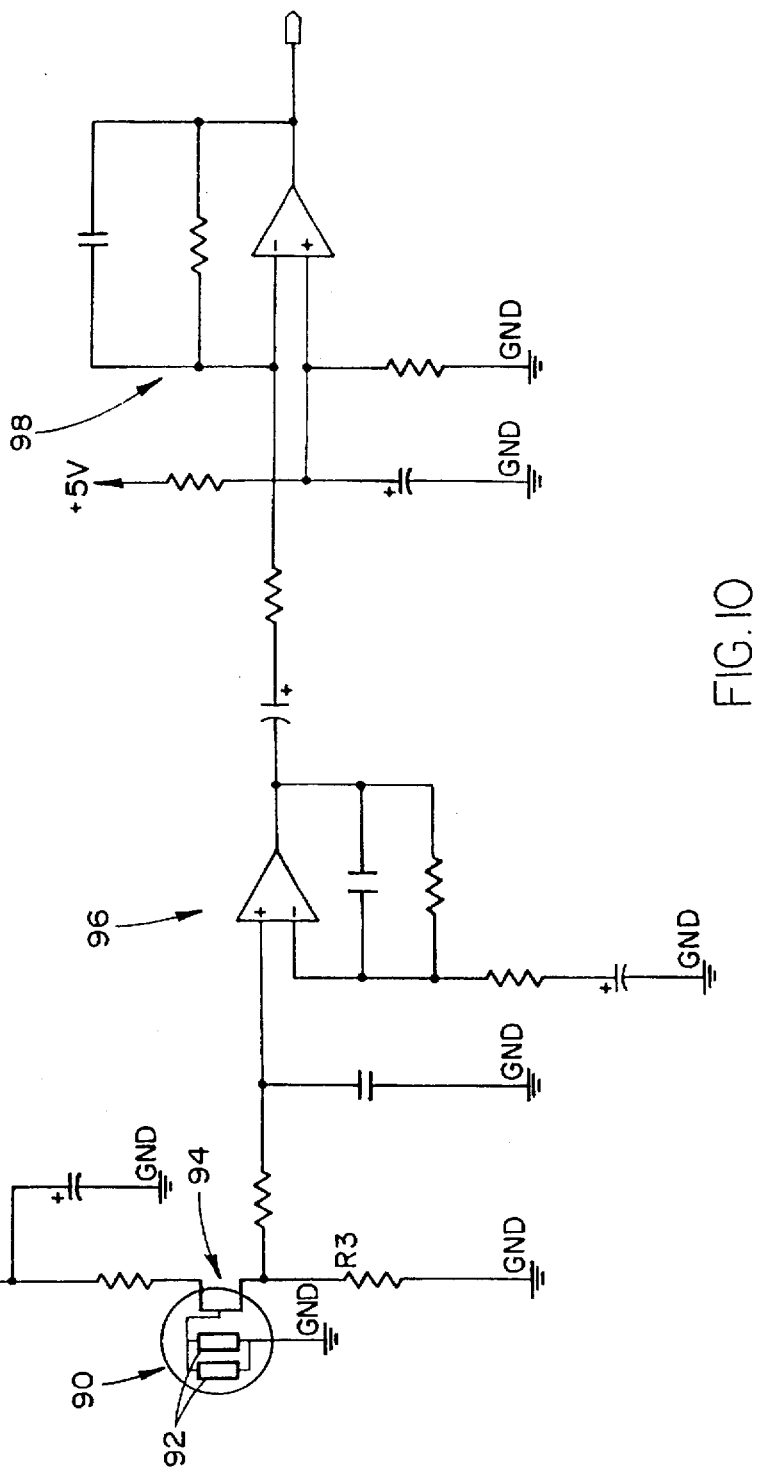
FIG. 10 is a schematic electrical diagram of an amplifier suitable for use in the embodiments of FIGS. 5 through 9.

FIG. 7 is a schematic illustration of a third embodiment of the present invention which also uses a single common optical lens array 70 with a single detector 72 for both security and energy management control, and an analog control switch 74 which controls amplification of the pyro output signal under control of a microcontroller 76 to configure the sensor as an energy management control sensor or as a security sensor. For instance, source resistor R3 as illustrated in FIG. 10 can be split into two resistors with their common junction feeding amplifier input 96, and by shorting the upper resistor electronically, the gain of the circuit can be changed. In one mode of operation, if the sensor is configured as an energy management control sensor when a trip (detected event) occurs, the controller 76 switches circuit 74 to a security sensor configuration for a period of time (e.g. 10 minutes or 50% of the delay time setting) and looks for security trips, and if no security trips are detected, the controller 76 returns the switch circuit 74 to the energy management control mode of operation.

Additionally, a pyroelectric detector with an array of sensing elements, i.e. more than a typical PIR quantity of two sensing elements, can be used to electronically control the number of fields of view provided by each lens array segment; thus pattern FOV (Field of View) density can be increased for the energy management control sensor by electronically adding more pyroelectric detector sensing elements and their corresponding processing circuits (external to the pyroelectric sensor).

Figure 8:
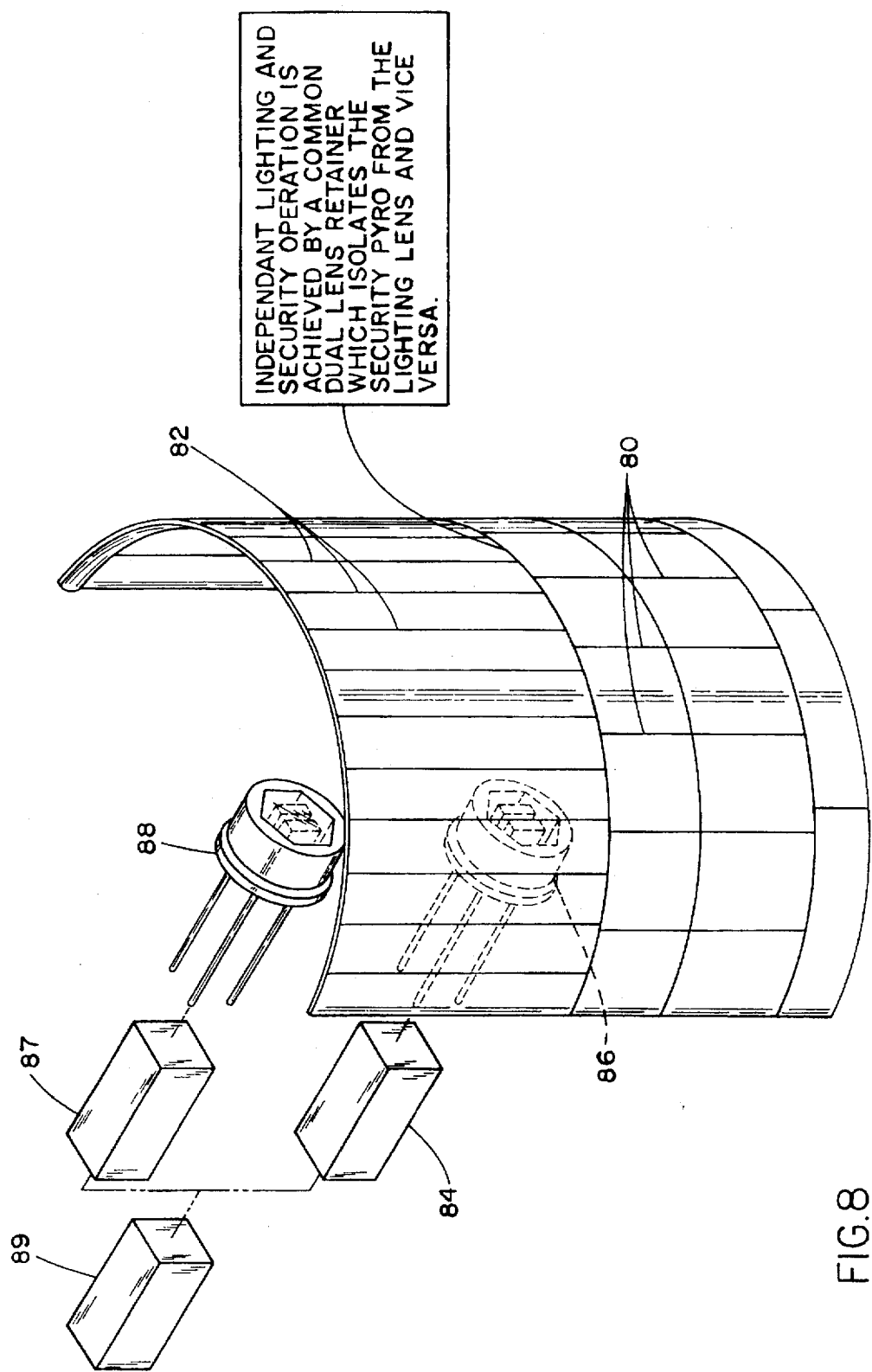
FIG. 8 is a schematic illustration of a further embodiment of the present invention which optimally designs a first optical lens array for security and optimally designs a second optical lens array for energy management control, a security amplifier is optimally designed with its own pyroelectric detector for the first optical lens array, and an energy management control amplifier is optimally designed with its own pyroelectric detector for the second optical lens array, and the outputs of these two amplifiers are processed as in the previous embodiments.

FIG. 8 illustrates a further embodiment of the present invention which optimally designs a first optical lens array 80 for security, and optimally designs a second optical lens array 82 for energy management control. Both optical arrays are preferably manufactured in a single combination array in a single piece of polyethylene lens material (each optical array has its own lens retainer but both retainers are combined in a single plastic enclosure part). A security pyroelectric detector 86 forms an input to a security amplifier 84 which is optimally designed pursuant to security criteria. An energy management control pyroelectric detector 88 forms an input to an energy management control amplifier 87 which is optimally designed pursuant to energy management control criteria. The outputs of these two amplifiers are then processed at 89 as in the previous embodiments.

Additionally, the energy management control sensing circuit can be used as an additional check of security detected motion. This is advantageous as it provides redundancy for false trips from electrical noise generated in the security sensing electronics, some false trips from environmentally generated stimuli in the optical pattern of detection, and environmentally generated stimuli in the sensor enclosure.

Figure 9:
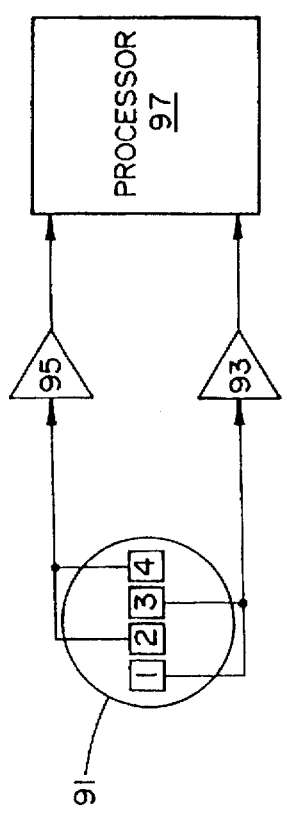
FIG. 9 is a schematic diagram of a multifunction passive infrared occupancy sensor wherein the pyrodetector comprises an array of four sensing elements, wherein the number of active sensing elements is electronically switched to control the number of fields of view provided by each lens array segment.

FIG. 9 illustrates a further embodiment of the present invention wherein a pyrodetector 91 includes four separate detector elements 1–4, typically 1 mm by 2 mm separated by 1 mm spaces. The outputs of detectors 1 and 3 are directed to an amplifier 93, and the outputs of detectors 2 and 4 are directed to an amplifier 95, and the outputs of both amplifiers 93 and 95 are input to a processor 97. The processor 97 can selectively process the outputs of all four detectors 1–4, or only detectors 1 and 3 or only detectors 2 and 4. In this type of embodiment, it is preferred that the pyrodetector comprises an array of three or more sensing elements, wherein each sensing element can form a separate input to the processor, or the outputs of two or more elements can be coupled together as illustrated in FIG. 9. The number of active sensing elements is electronically switched by the processor 97 to control the number of fields of view provided by each lens array segment, to decrease the field of view intensity for the energy management control sensor by adding sensing elements, and to increase the field of view intensity for the security sensor by subtracting sensing elements.

The embodiment of FIG. 9 can also be used in a verification mode. For instance, if detectors 1 and 3 are being used in a security mode and a trip (detected event) occurs, the processor can switch to detectors 2 and 4 and verify the trip by the detection of another trip with detectors 2 and 4.

FIG. 10 is a schematic electrical diagram of an amplifier suitable for use in the embodiments of FIGS. 5 through 8. A typical prior art detector 90 includes two separate detector or sensor elements 92, which are coupled together, for example in parallel or series opposed, in this circuit to form one summed output signal which is source followed by FET 94 and bandpass filtered and amplified in circuit sections 96 and 98 to form an output signal which, depending upon the particular embodiment, might be an input to an A/D converter.

While several embodiments and variations of the present invention for a multifunction occupancy sensor are described in detail herein, it should be apparent that the disclosure and teachings of the present invention will suggest many alternative designs to those skilled in the art.

What is claimed is:

1. A multifunction passive infrared occupancy sensor which functions as an occupancy sensor for security systems and also as an occupancy sensor for energy management control systems comprising:

a. a segmented infrared lens array means, wherein the segments of the infrared lens array means establish different optical lobes in the field of view of the occupancy sensor;

b. a pyroelectric infrared detector means, positioned at or near the focal point of the segmented infrared lens array means, for detecting movement of infrared sources within the field of view of the occupancy sensor and producing an output signal representative thereof;

c. a processor comprising a first processing means for analyzing the output signal of the detector for security detection purposes by detecting changes in the output signal greater than a given security threshold, and a second processing means for analyzing the output signal of the detector for energy management purposes by detecting changes in the output signal greater than a given energy management threshold, wherein the energy management threshold of the second processing means is less than the security threshold of the first processing means.

2. A multifunction passive infrared occupancy sensor as claimed in claim 1, wherein the segmented infrared lens array means comprises a single optical lens array.

3. A multifunction passive infrared occupancy sensor as claimed in claim 2, wherein the single optical lens array is designed to meet security requirements and provides an optical gain of 2X or more, and a minimal number of optical segment fields of view which provides less sensitivity to small movements within the field of view of the sensor than an optical lens array designed for energy management requirements.

4. A multifunction passive infrared occupancy detector as claimed in claim 2, wherein the first processing means comprises a first processing circuit for detecting changes in the detector output signal greater than the given security threshold, and the second processing means comprises a second processing circuit for detecting changes in the detector output signal greater than the given energy management threshold.

5. A multifunction passive infrared occupancy sensor as claimed in claim 1, wherein the detector output signal is coupled to an analog to digital converter, the output of which is coupled to the processor which comprises a single digital processor which utilizes one of two different software processing routines, the first processing routine utilizing a security threshold and the second processing routine utilizing an energy management threshold.

6. A multifunction passive infrared occupancy sensor as claimed in claim 1, wherein an analog control switch controls amplification of the detector output signal under control of a microcontroller to configure the sensor as an energy management control sensor with a greater circuit amplification gain or as a security sensor with a lesser circuit amplification gain.

7. A multifunction passive infrared occupancy sensor as claimed in claim 1, wherein the detector means comprises an array of a number of separate sensing elements, wherein the number of active sensing elements is electronically switched to control the number of fields of view provided by each lens array segment, to increase the field of view density for the energy management control sensor by adding sensing elements, and to decrease the field of view density for the security sensor by subtracting sensing elements.

8. A multifunction passive infrared occupancy sensor as claimed in claim 7, wherein the number of separate detector elements in the array comprises three or more detector elements.

9. A multifunction passive infrared occupancy sensor as claimed in claim 7, wherein a processor electronically switches the number of active sensing elements to control the number of fields of view provided by each lens array segment.

10. A multifunction passive infrared occupancy sensor as claimed in claim 1, wherein the lens means comprises a first optical lens array designed for security and having a first number of lens segments, and a second optical lens array designed for energy management and having a second number of lens segments, greater than said first number of lens segments, which provides greater sensitivity to small movements within the field of view of the sensor.

11. A multifunction passive infrared occupancy sensor as claimed in claim 1, wherein the detection means comprises a separate security detector and a separate energy management detector, and further comprises a separate security amplifier having a security amplification gain, and a separate energy management amplifier having an energy management circuit amplification gain which is greater than the security amplification gain.

12. A multifunction passive infrared occupancy sensor as claimed in claim 11, wherein the ratio of energy management amplifier gain to the security amplifier gain is in the range of 3:1 to 5:1.

13. A multifunction passive infrared occupancy sensor as claimed in claim 1 wherein the segmented infrared lens has an optical gain in the range of 1X to 4X.

14. A multifunction passive infrared occupancy sensor as claimed in claim 1, wherein the processor detects predetermined positive or negative changes in the output signal from a baseline average voltage level.

15. A multifunction passive infrared occupancy sensor as claimed in claim 14, wherein the predetermined changes in the output signal are greater than 500 millivolts.

16. A multifunction passive infrared occupancy sensor as claimed in claim 14, wherein the processor detects two sequential changes of opposite polarity in the output signal which occur within a window timeframe.

17. A multifunction passive infrared occupancy sensor as claimed in claim 16, wherein the window timeframe is greater than 75 milliseconds and less than 2 seconds.

18. A multifunction passive infrared occupancy detector as claimed in claim 14, wherein the first and second processing means detect three or more sequential changes in the output signal of alternating opposite polarity and adjacent changes in the output signal occur within a window timeframe.

19. A multifunction passive infrared occupancy sensor as claimed in claim 18, wherein the window timeframe is greater than 75 milliseconds and less than 2 seconds.

20. A multifunction passive infrared occupancy sensor as claimed in claim 1, wherein the multifunction sensor is normally configured as an energy management control sensor and when a detected event occurs, the sensor switches to a security sensor configuration for a period of time and looks for security detected events, and if no security events are detected, the sensor returns to an energy management control sensor.

* * * * *